(12) United States Patent
Zhang et al.

(10) Patent No.: US 12,342,536 B2
(45) Date of Patent: Jun. 24, 2025

(54) SEMICONDUCTOR MEMORY DEVICE HAVING BURIED WORD LINE WITH A NECK PROFILE PORTION

(71) Applicant: Fujian Jinhua Integrated Circuit Co., Ltd., Quanzhou (CN)

(72) Inventors: Janbo Zhang, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 437 days.

(21) Appl. No.: 17/742,372

(22) Filed: May 11, 2022

(65) Prior Publication Data
US 2023/0292499 A1  Sep. 14, 2023

(30) Foreign Application Priority Data

Mar. 10, 2022 (CN) .......................... 202210229784.X
Mar. 10, 2022 (CN) .......................... 202220517452.7

(51) Int. Cl.
*H10B 12/00* (2023.01)
(52) U.S. Cl.
CPC .................................. *H10B 12/50* (2023.02)
(58) Field of Classification Search
CPC ...... H10B 12/50; H10B 12/053; H10B 12/09; H10B 12/34; H10B 12/488

USPC ......................................................... 257/296
See application file for complete search history.

(56) References Cited

U.S. PATENT DOCUMENTS

| | | | | |
|---|---|---|---|---|
| 5,300,814 A | * | 4/1994 | Matsumoto | H01L 23/528 257/920 |
| 5,872,611 A | * | 2/1999 | Hirata | G02F 1/133371 349/147 |
| 10,490,556 B1 | * | 11/2019 | Su | H01L 21/31055 |
| 11,177,264 B2 | | 11/2021 | Jeon | |
| 11,508,733 B2 | | 11/2022 | Noh | |
| 2010/0270602 A1 | * | 10/2010 | Choi | H10B 12/09 257/296 |
| 2013/0328160 A1 | * | 12/2013 | Ota | H10B 12/488 257/506 |
| 2018/0190672 A1 | * | 7/2018 | Lee | H01L 27/156 |
| 2020/0203212 A1 | | 6/2020 | Reshotko | |
| 2023/0262965 A1 | | 8/2023 | Lu | |

* cited by examiner

*Primary Examiner* — Duy T Nguyen
(74) *Attorney, Agent, or Firm* — Winston Hsu

(57) ABSTRACT

A semiconductor memory device including an array region and a peripheral region surrounding the array region. The array region includes a plurality of active regions and a first insulating layer disposed between the active regions. The peripheral region includes a peripheral structure, a second insulating layer surrounding the peripheral structure, and a third insulating layer surrounding the second insulating layer. At least a buried word line extends through the array region and the peripheral region, wherein a portion of the buried word line through the second insulating layer comprises a neck profile from a plan view.

13 Claims, 4 Drawing Sheets

SEMICONDUCTOR MEMORY DEVICE HAVING BURIED WORD LINE WITH A NECK PROFILE PORTION

BACKGROUND OF THE INVENTION

1. Field of the Invention

The present invention is related to a semiconductor memory device. More particularly, the present invention relates to a semiconductor memory device including buried word lines.

2. Description of the Prior Art

A dynamic random access memory (DRAM) is one kind of volatile memory. A DRAM usually includes memory region including a plurality of memory cells and a peripheral region including control circuits. Typically, a memory cell includes one transistor and one capacitor electrically coupled to the transistor, which is known as a 1T1C cell. A digital data is stored in a memory cell by controlling the transistor to charge or discharge the capacitor. The control circuits in the peripheral region may address each of the memory cells in the array region by plural columns of word lines and plural rows of bit lines traversing through the array region and electrically connected to each of the memory cells to perform reading, writing or erasing data.

In advanced technology, by adopting three-dimensional structure, the size of the memory cells of a DRAM may be greatly miniaturized and a higher integrity may be achieved. Buried word line structures have been proposed and widely used in the field. How to reduce the resistance differences between the buried word lines to obtain more consistent signal delay times is an important research topic in the field.

SUMMARY OF THE INVENTION

One objective of the present invention is to provide a semiconductor memory device including an array of active regions, a peripheral structure surrounding the array of active regions, and a plurality of buried word lines extending through the array of active regions and the peripheral structure. The buried word lines respectively have a narrowest portion having a neck profile formed near an outer edge of the peripheral structure. Since the narrowest portions of the buried word lines are controlled adjacent to the edge of the peripheral structure, the resistance and signal delay time between the word lines may be more consistent, so that an improved performance may be achieved.

One embodiment of the present invention provides a semiconductor memory device including an array region and a peripheral region surrounding the array region. The array region includes a plurality of active regions and a first insulating layer disposed between the active regions. The peripheral region includes a peripheral structure, a second insulating layer surrounding the peripheral structure, and a third insulating layer surrounding the second insulating layer. At least a buried word line extends through the array region and the peripheral region, wherein a portion of the buried word line through the second insulating layer comprises a neck profile from a plan view.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
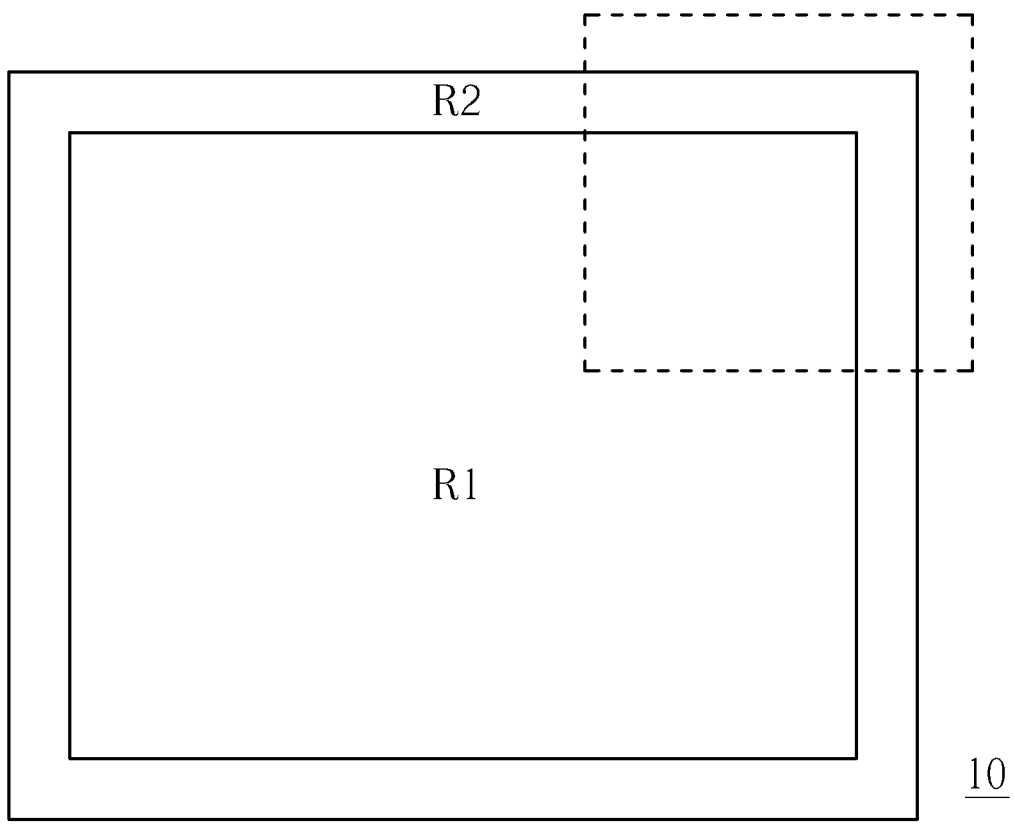
FIG. 1 is a schematic plan view of a semiconductor memory device according to an embodiment of the present invention.
Figure 2:
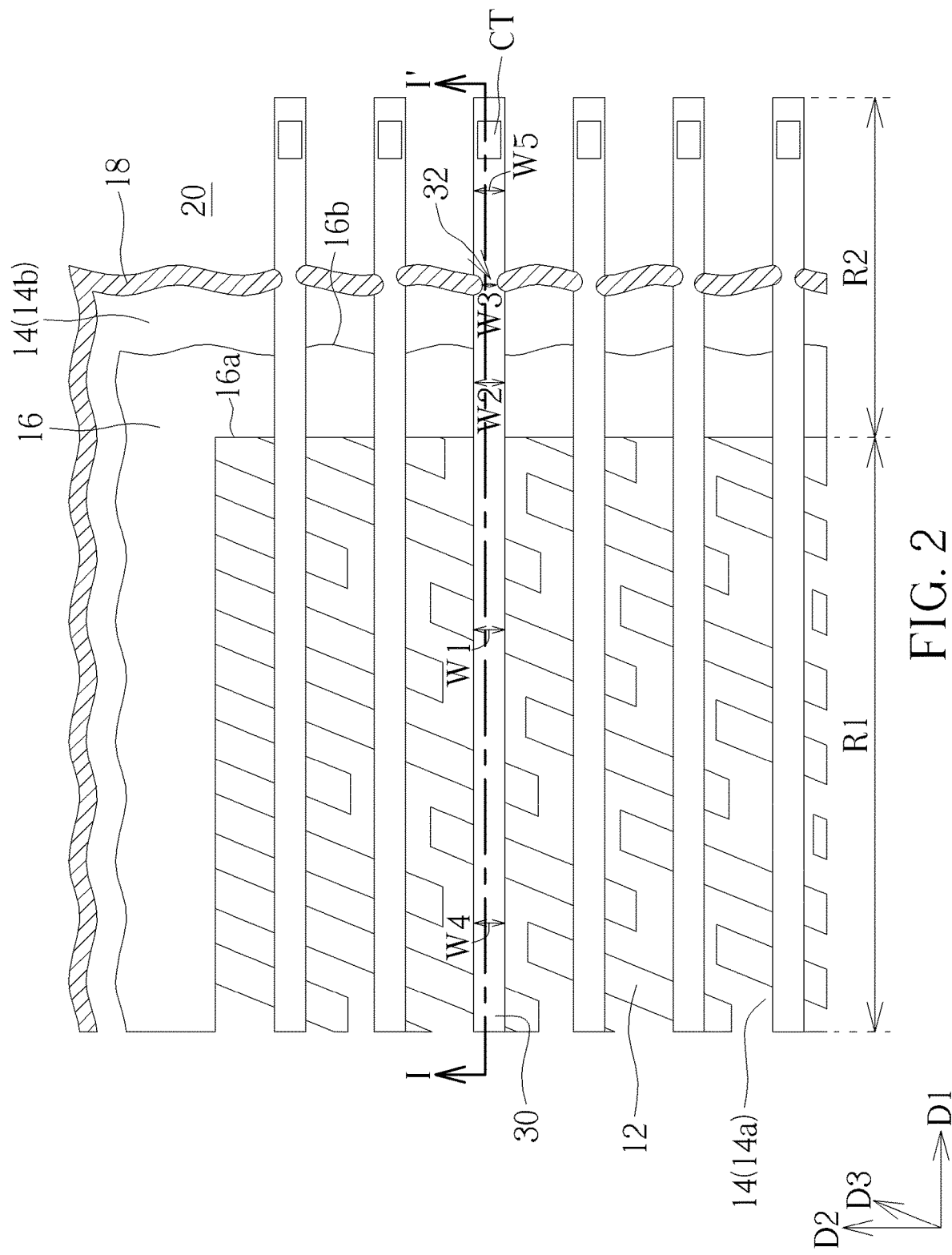
FIG. 2 is a partial enlarged view of the semiconductor memory device shown in FIG. 1.
Figure 3:
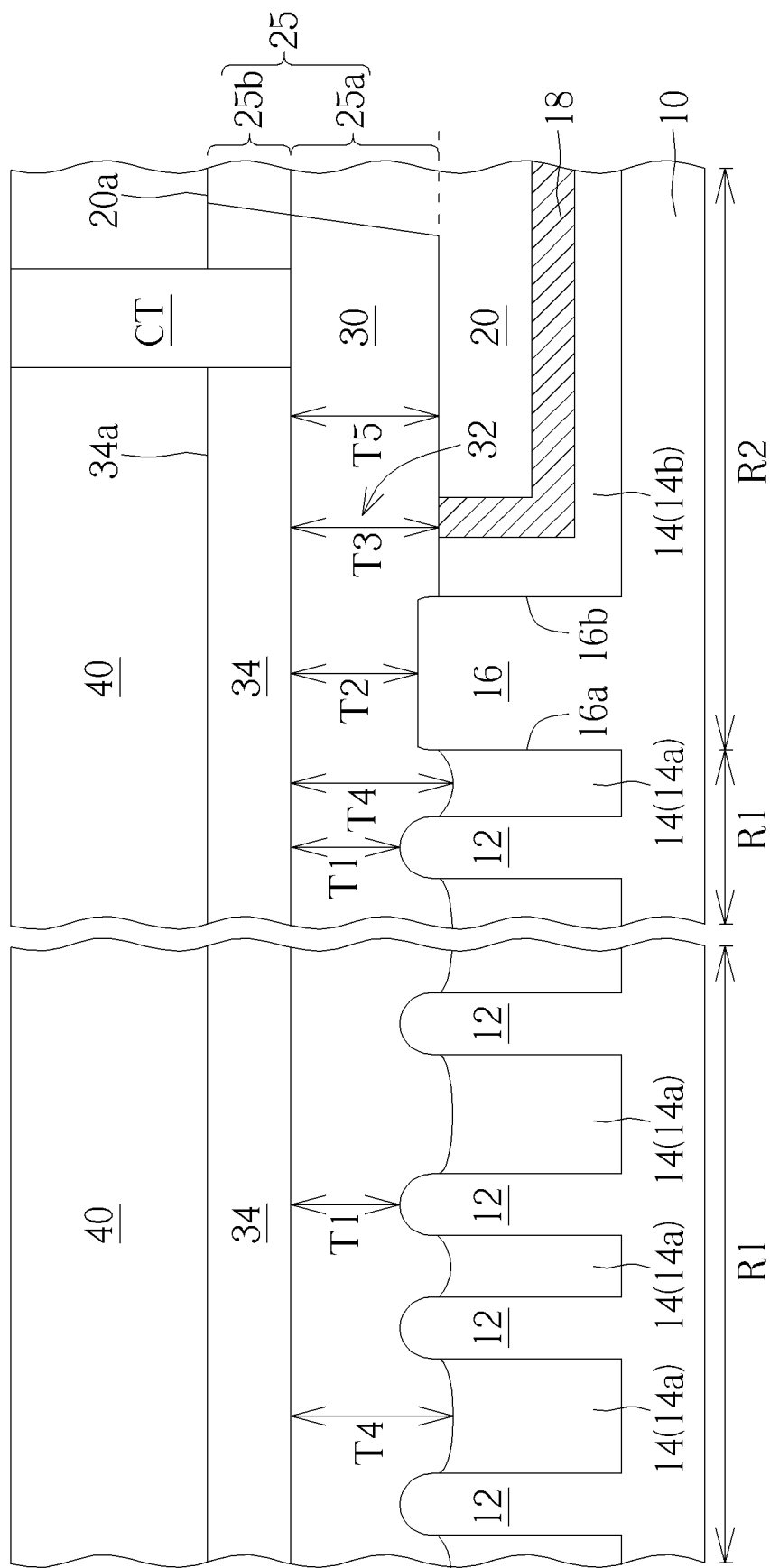
FIG. 3 is a schematic cross-sectional view taken along the line I-I' that is along one of the buried word lines of the semiconductor memory device as shown in FIG. 2.

Please refer to FIG. 1, FIG. 2 and FIG. 3. FIG. 1 is a schematic plan view of a semiconductor memory device according to an embodiment of the present invention. FIG. 2 is an enlarged view of the portion marked by dashed line of the semiconductor memory device shown in FIG. 1. FIG. 3 is a schematic cross-sectional view taken along the line I-I' that is along one of the buried word lines of the semiconductor memory device as shown in FIG. 2. The extending direction of the line I-I' is D1. The semiconductor memory device may be a DRAM device. To simplify the drawings, the interlayer dielectric layer 40 and the insulating capping layer 34 shown in FIG. 3 are not shown in FIG. 2. Other components of the semiconductor memory device such as bit lines, storage node contacts, storage node contact pads and capacitors are believed to be well-known in the art, and are omitted in the drawings and would not be illustrated in detail in the following descriptions for brevity.

As shown in FIG. 1, the semiconductor memory device includes a substrate 10 including an array region R1 and a peripheral region R2 around the array region R1. As shown FIG. 2 and FIG. 3, the array region R1 includes a plurality of parallel active regions 12 and a first insulating layer 14 (the first portion 14a of the first insulating layer 14) disposed between the active regions 12. A plurality of word lines 30 formed in the substrate 10 and extend through the array region R1 and the peripheral region R2 along the first direction D1. The active regions 12 respectively extend lengthwise along the direction D3 and are arranged along the direction D2 and the direction D1 to form an array. D1, D2 and D3 are different directions, wherein the directions D2 and D1 are perpendicular, and the directions D3 and D2 may include an angle between 30 and 75 degrees.

The peripheral region R2 includes, from the inner side closer to the array region R1 to the outer side away from the array region R1, a peripheral structure 16, another portion (the second portion 14b) of the first insulating layer 14, a second insulating layer 18, and a third insulating layer 20. Some of the active regions 12 may be connected to an inner edge 16a of the peripheral structure 16. The second portion 14b of the first insulating layer 14 and the second insulating layer 18 surround the outer edge 16b of the peripheral structure 16. The peripheral structure 16 and the second insulating layer 18 are separated by the second portion 14b of the first insulating layer 14 and are not in direct contact with each other. As shown in FIG. 2, the outer edge 16b of the peripheral structure 16 may include a wavy profile, so that the second portion 14b of the first insulating layer 14 and the second insulating layer 18 conformal to the outer edge 16b may include a wavy profile, respectively. The third insulating layer 20 surrounds the second insulating layer 18. The third insulating layer 20 and the second portion 14b of the first insulating layer 14 are separated by the second insulating layer 18 and are not in direct contact with each other.

The buried word lines 30 are formed in the substrate 10 and arranged in parallel along the direction D2. The buried word lines 30 cut through the active regions 12, the first insulating layer 14, the peripheral structure 16, the second insulating layer 18, and the third insulating layer 20, and divide each of the active regions 12 into a middle portion and two end portions. An insulating capping layer 34 is disposed directly on each of the buried word lines 30 and extends along the buried word lines 30. An interlayer dielectric layer 40 is formed on the array region and the peripheral region R2 of the substrate 10. A plurality of word line contacts CT are formed through the interlayer dielectric layer 40 and the insulating capping layers 34 to directly contact the end portion of each of the buried word lines 30 that are may terminate in the third insulating layer 20.

The active regions 12, the peripheral structure 16, the first insulating layer 14, the second insulating layer 18, and the third insulating layer 20 may be formed by the following process. After providing the substrate 10, for example, a silicon substrate, an epitaxial silicon substrate, a silicon germanium (SiGe) substrate, a silicon carbide (SiC) substrate, or a silicon-on-insulator (SOI) substrate, a patterning process (such as photolithography-etching process, double patterning process, multiple patterning process, spacer double patterning process, but is not limited thereto) is performed to form isolation trenches (not shown) in the substrate 10 and define the active regions 12 and the peripheral structure 16 in the substrate 10. Subsequently, an oxidation process (such as thermal oxidation process or in-situ steam generation oxidation process) may be performed to grow the first insulating layer 14 along the exposed surface of the substrate 10 and the sidewalls and bottom surfaces of the isolation trenches. The first insulating layer 14 is made of silicon oxide. The thickness of the first insulating layer 14 continues to grow until the first portion 14a of the insulating layer 14 completely fills the isolation trenches in the array region R1, and the second portion 14b of the insulating layer 14 conformally covers the sidewalls and bottom surfaces of the isolation trench in the peripheral region R2 and surrounds the outer edge 16b of the peripheral structure 16. In some embodiments of the present invention, the first insulating layer 14 may be formed by a deposition process (such as atomic layer deposition process) having good gap fill capability to fill the isolation trenches in the array region R1. Subsequently, a deposition process (such as chemical vapor deposition process, physical vapor deposition process, or atomic layer deposition process) may be performed to form the second insulating layer 18 and the third insulating layer 20 on the first insulating layer 14 until the isolation trench in the peripheral region R2 are completely filled. A planarization process (such as chemical mechanical polishing process) may be performed to remove unnecessary portions of the third insulating layer 20, the second insulating layer 18 and the first insulating layer 14 until the top surfaces of the active regions 12 and the peripheral structure 16 are exposed. After the planarization process, the top surfaces of the third insulating layer 20, the second insulating layer 18, the first insulating layer 14, the active regions 12, and the peripheral structure 16 may be coplanar and flush with each other. The second insulating layer 18 and the third insulating layer 20 respectively include a dielectric material. In some embodiments of the present invention, the second insulating layer 18 includes silicon nitride (SiN) and the third insulating layer 20 may include silicon oxide ($SiO_x$). The second insulating layer 18 may reduce loss of the second portion 14b of the first insulating layer 14 during subsequent manufacturing process, so that the depth of the divot between the outer edge 16b of the peripheral structure 16 and the second insulating layer 18 may be reduced. The third insulating layer 20 is the main filling material of the isolation trenches in the peripheral region R2.

The buried word lines 30, the insulating capping layers 34, the interlayer dielectric layer 40 and the word line contacts CT may be formed by the following process. After the planarization process, another patterning process is performed to form a plurality of word line trenches 25 in the substrate 10 and extending along the direction D1 to cut through the active regions 12, the first insulating layer 14, the peripheral structure 16, the second insulating layer 18 and the third insulating layer 20. Subsequently, an oxidation process and/or a deposition process may be performed to form a gate dielectric layer (not shown) and a conductive layer (not shown) on the gate dielectric layer in each of the word line trenches 25. The gate dielectric layer may include a dielectric material, such as silicon oxide ($SiO_x$), silicon nitride (SiN), or a high-k dielectric material but is not limited thereto. The conductive layer may include a metal, such as tungsten (W), copper (Cu), aluminum (Al), titanium (Ti), tantalum (Ta), a metal compound or a metal alloy of the above metals, but is not limited thereto. A planarization process may be performed to remove unnecessary portions of the gate dielectric layer and the conductive layer outside the word line trenches 25. Following, the conductive layer in each of the word line trenches 25 may be etched back to fill only the lower portions 25a of the word line trenches 25. After that, a deposition process is performed to form an insulating layer on the substrate 10 and filling the upper portions 25b of the word line trenches 25, and another planarization process is then performed to remove the insulating layer outside the word line trenches 25, thereby forming the insulating capping layers 34 on the buried word lines 30. The insulating capping layers 34 may include silicon oxide ($SiO_x$) or silicon nitride (SiN), but is not limited thereto. As shown in FIG. 3, the top surface 34a of the insulating capping layer 34 and the top surface 20a of the third insulating layer 20 may be coplanar. Following, a plurality of bit lines (not shown) extending along the direction D2 and arranged in parallel along the direction D1 are formed on the substrate 10. The interlayer dielectric layer 40 is then formed on the substrate 10 and fills the spaces between the bit lines. The interlayer dielectric layer 40 may include silicon oxide or silicon nitride, but is not limited thereto. The word line contact CT may include a metal, such as tungsten (W), copper (Cu), aluminum (Al), titanium (Ti), tantalum (Ta), a metal compound or a metal alloy of the above metals, but is not limited thereto. Later, the word line contacts CT and the storage node contacts (not shown) may be formed in the interlayer dielectric layer 40 by performing semiconductor manufacturing processes such as patterning process, etching process, deposition process, and planarization process that are well known in the art. The word line contacts CT respectively contacts one of the line end portions of the buried word lines 30. The storage node contacts (not shown) respectively contact one of the end portions of the active regions 12.

It is noteworthy that the etching process for forming the word line trenches 25 may have different etching behavior for different materials, so that the portions of the word line trenches 25 cutting through different materials (such as silicon, silicon oxide, or silicon nitride) may have different widths and depths. As a result, each of the buried word lines 30 may have different widths and depths along the direction D1.

For example, as shown in FIG. 2 and FIG. 3, a portion of the buried word line 30 cutting through the active regions 12 may have a first width W1 and a first thickness T1. A portion of the buried word line 30 cutting through the peripheral structure 16 may have a second width W2 and a second thickness T2. A portion of the buried word line 30 cutting through the second insulating layer 18 may have a third width W3 and a third thickness T3. A portion of the buried word line 30 cutting through first portion 14b of the first insulating layer 14 in the array region R1 may have a fourth width W4 and a fourth thickness W4. A portion of the buried word line 30 cutting through the third insulating layer 20 may have a fifth width W5 and a fifth thickness T5. In some embodiments of the present invention wherein the active regions 12 and the peripheral structure 16 are both made from a silicon substrate, the first insulating layer 14 is made of silicon oxide, the second insulating layer 18 is made of silicon nitride, and the third insulating layer 20 is made of silicon oxide, the first width W1 and the second width W2 of the buried word line 30 may be approximately the same, and the second thickness T2 may be larger than the first thickness T1. Furthermore, the fourth width W4 and the fifth width W5 may be approximately the same and are larger than or equal to the first width W1 and the second width W2. The fourth thickness T4 is larger than the first thickness T1 and the second thickness T2. Optionally, the etching process for forming the word line trench 25 may be adjusted to make the portions of the word line trench 25 through the first insulating layer 14 and the active regions 12 have the same width, that is, the first width W1 and the fourth width W4 of the buried word line 30 may be the same. In this case, as shown in FIG. 2, the portion of the buried word line 30 in the array region R1 may have a smooth edge profile. It is noteworthy that the portion of each of the buried word lines 30 cutting through the second insulating layer 18 (the portion has the third width W3 and the third thickness T3) may have a neck profile 32 and is the narrowest portion of each of the buried word lines 30. That is, the neck profile portion has the third width W3 that is smaller than the first width W1, the second width W2, the fourth width W4 and the fifth width W5.

According to an embodiment of the present invention, the third thickness T3 is equal to the fifth thickness T5 and larger than the first thickness T1 and the second thickness T2, and is smaller than the fourth thickness T4. The portion with the neck profile 32 is also the high resistance portion of each of the buried word lines 30. By forming the second insulating layer 18 surrounding the outer edge 16b of the peripheral structure 16 and also completely filling the isolation trenches in the array region R1 with the first insulating layer 14 (first portion 14a) to avoid any of the second insulating layer 18 being filled in the array region R1, the present invention may effectively control the high resistance portion (the neck profile portion) of each of the buried word lines 30 being formed adjacent to the outer edge 16b of the peripheral structure 16 by cutting through the second insulating layer 18 instead of being formed at random locations in the array region R1 or any unexpected portions of the each of the buried word line 30. In this way, the resistance and signal delay time between the word lines may be more consistent, so that an improved performance may be achieved.

Figure 4:
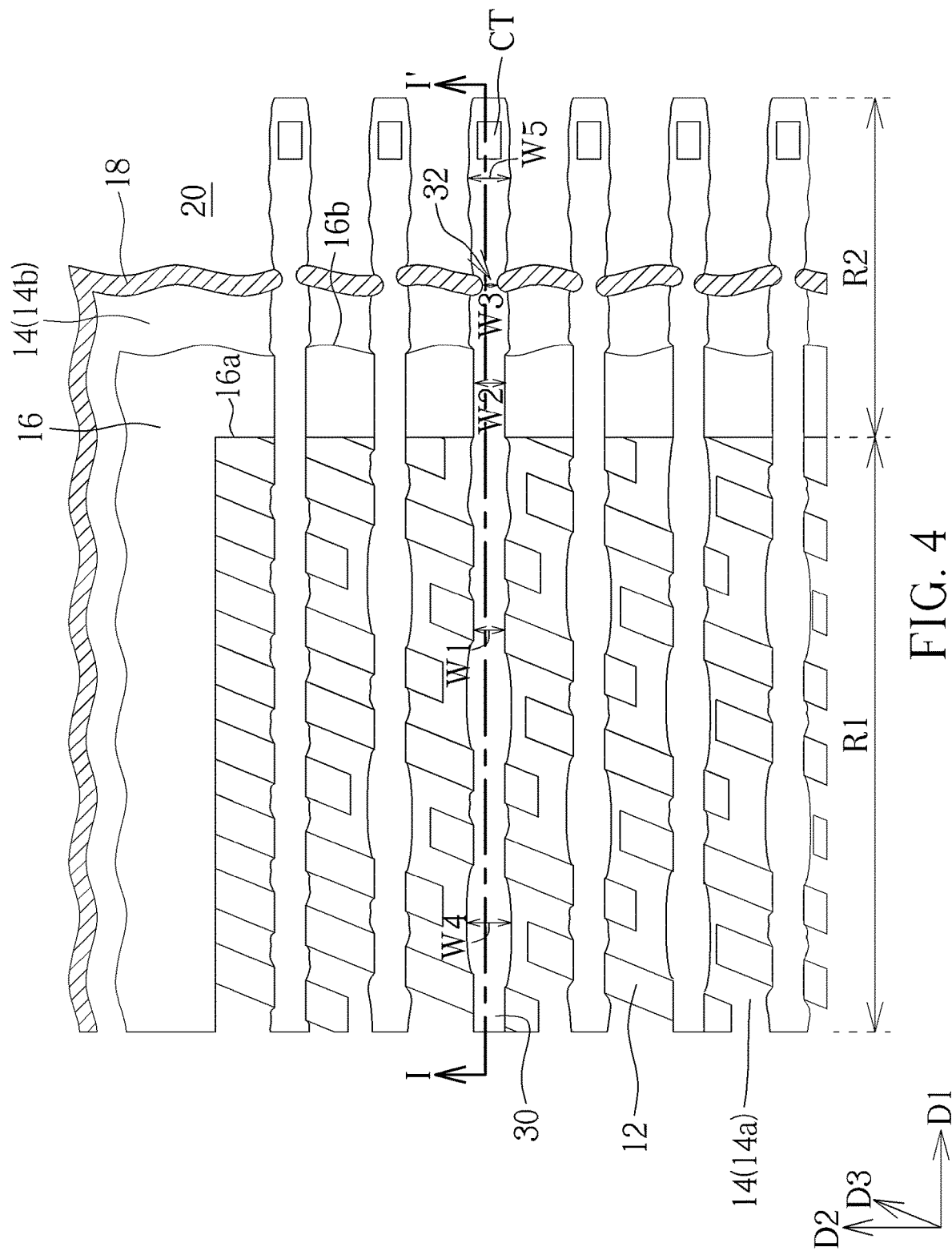
FIG. 4 is a partial enlarged view of a semiconductor memory device according to another embodiment of the present invention.

Please refer to FIG. 4, which is a partial enlarged view of a semiconductor memory device according to another embodiment of the present invention. The etching process for forming the word line trench 25 may be adjusted to make the portions of the word line trench 25 through the first insulating layer 14 and the active regions 12 have different widths, so that the first width W1 and the fourth width W4 of the buried word line 30 may be different. In this case, as shown in FIG. 4, the portion of the buried word line 30 in the array region R1 may have a wavy edge profile.

In conclusion, in the semiconductor memory device provided by the present invention, a second insulating layer is formed along the outer edge of the peripheral structure, by which the buried word lines may have the high resistance portions (the neck profile portions formed by cutting through the second insulating layer) being formed adjacent to the edge of the peripheral structure instead of being formed at random locations in the array region. In this way, the resistance and signal delay time between the word lines may be more consistent, and an improved performance of the semiconductor device may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
an array region comprising a plurality of active regions and a first portion of a first insulating layer disposed between the active regions;
a peripheral region next to the array region, and comprising:
a peripheral structure;
a second insulating layer at a side of the peripheral structure opposite to the array region; and
a second portion of the first insulating layer disposed between the peripheral structure and the second insulating layer, wherein the peripheral structure and the second insulating layer are not in direct contact with each other by being separated by the second portion of the first insulating layer; and
at least a buried word line extending through the active regions and the first portion of the first insulating layer in the array region and the second portion of the first insulating layer, the second insulating layer in the peripheral region, wherein a neck profile portion of the buried word line through the second insulating layer comprises a neck profile from a plan view.

2. The semiconductor memory device according to claim 1, wherein from the plan view, a first portion of the buried word line through the active regions comprises a first width, a second portion of the buried word line through the peripheral structure comprises a second width, the neck profile portion comprises a third width, wherein the third width is smaller than the first width and the second width.

3. The semiconductor memory device according to claim 2, wherein the first width and second width are the same.

4. The semiconductor memory device according to claim 2, further comprising a third insulating layer in the peripheral region and at a side of the second insulating layer opposite to the second portion of the first insulating layer, wherein a fourth portion of the buried word line through the first portion of the first insulating layer comprises a fourth width, a fifth portion of the buried word line through the third insulating layer comprises a fifth width, wherein the fourth width and the fifth width are larger than or equal to the first width and the second width.

5. The semiconductor memory device according to claim 4, wherein the fourth width and the fifth width are the same.

6. The semiconductor memory device according to claim 4, wherein the second portion of the first insulating layer and the third insulating layer are not in direct contact with each other by being separated by the second insulating layer.

7. The semiconductor memory device according to claim 4, wherein the first portion of the first insulating layer, the second portion of the first insulating layer, and the third insulating layer are made of silicon oxide, the second insulating layer is made of silicon nitride.

8. The semiconductor memory device according to claim 1, wherein from a cross-sectional view, a first portion of the buried word line through the active regions comprises a first thickness, a second portion of the buried word line through the peripheral structure comprises a second thickness, the neck profile portion comprises a third thickness, wherein the third thickness is larger than the first thickness and the second thickness.

9. The semiconductor memory device according to claim 8, wherein the second thickness is larger than the first thickness.

10. The semiconductor memory device according to claim 8, wherein a fourth portion of the buried word line through the first portion of the first insulating layer comprises a fourth thickness, the fourth thickness is larger than the first thickness, the second thickness and the third thickness.

11. The semiconductor memory device according to claim 8, further comprising a third insulating layer in the peripheral region and at a side of the second insulating layer opposite to the second portion of the first insulating layer, wherein a fifth portion of the buried word line through the third insulating layer comprises a fifth thickness, wherein the fifth thickness and the third thickness are the same.

12. The semiconductor memory device according to claim 11, further comprising an insulating capping layer disposed on the buried word line, wherein a top surface of the insulating capping layer is flush with a top surface of the third insulating layer.

13. The semiconductor memory device according to claim 1, wherein the second insulating layer comprises a wavy profile from the plan view.

* * * * *